United States Patent
Shimizu et al.

(10) Patent No.: US 10,186,596 B2
(45) Date of Patent: Jan. 22, 2019

(54) SILICON CARBIDE (SIC) MOSFET WITH A SILICON OXIDE LAYER CAPABLE OF SUPPRESSING DETERIORATION OF CARRIER MOBILITY AND VARIATION IN THRESHOLD VOLTAGE

(71) Applicants: Kabushiki Kaisha Toshiba, Minato-ku (JP); National Institute for Materials Science, Tsukuba-shi (JP)

(72) Inventors: Tatsuo Shimizu, Shinagawa (JP); Takahisa Ohno, Tsukuba (JP); Tomoaki Kaneko, Tsukuba (JP); Takahiro Yamasaki, Tsukuba (JP); Nobuo Tajima, Tsukuba (JP); Jun Nara, Tsukuba (JP)

(73) Assignees: Kabushiki Kaisha Toshiba, Minato-ku (JP); National Institute for Materials Science, Tsukuba-shi (JP)

( * ) Notice: Subject to any disclaimer, the term of this patent is extended or adjusted under 35 U.S.C. 154(b) by 16 days.

(21) Appl. No.: 15/586,755

(22) Filed: May 4, 2017

(65) Prior Publication Data
US 2017/0345657 A1    Nov. 30, 2017

(30) Foreign Application Priority Data

May 30, 2016    (JP) .................................. 2016-107937

(51) Int. Cl.
*H01L 29/66* (2006.01)
*H01L 29/16* (2006.01)
(Continued)

(52) U.S. Cl.
CPC .. *H01L 29/66068* (2013.01); *H01L 21/02164* (2013.01); *H01L 21/02236* (2013.01); *H01L 21/02348* (2013.01); *H01L 21/049* (2013.01); *H01L 21/67115* (2013.01); *H01L 29/1095* (2013.01); *H01L 29/1608* (2013.01); *H01L 29/408* (2013.01); *H01L 29/517* (2013.01); *H01L 29/7802* (2013.01)

(58) Field of Classification Search
CPC . H01L 29/1095; H01L 29/1608; H01L 29/24; H01L 29/408; H01L 29/517; H01L 29/66068; H01L 29/7802; H01L 21/02164; H01L 21/02236; H01L 21/02348; H01L 21/049; H01L 21/67115
See application file for complete search history.

(56) References Cited

U.S. PATENT DOCUMENTS

| 9,496,365 B2 | 11/2016 | Shimizu |
| 2005/0017272 A1 | 1/2005 | Yamashita et al. |

(Continued)

FOREIGN PATENT DOCUMENTS

| JP | 2000-252461 | 9/2000 |
| JP | 2015-61069 | 3/2015 |
| WO | WO 03/047000 A1 | 6/2003 |

*Primary Examiner* — Andrew Q Tran
(74) *Attorney, Agent, or Firm* — Oblon, McClelland, Maier & Neustadt, L.L.P.

(57) ABSTRACT

A semiconductor device according to an embodiment includes a silicon carbide layer, a gate electrode, and a silicon oxide layer disposed between the silicon carbide layer and the gate electrode, a number of single bonds between carbon atoms being larger than that of double bonds between carbon atoms in the silicon oxide layer.

14 Claims, 10 Drawing Sheets

(51) Int. Cl.
*H01L 29/10* (2006.01)
*H01L 29/40* (2006.01)
*H01L 29/78* (2006.01)
*H01L 21/02* (2006.01)
*H01L 21/04* (2006.01)
*H01L 21/67* (2006.01)
*H01L 29/51* (2006.01)

(56) References Cited

U.S. PATENT DOCUMENTS

2011/0049530 A1* 3/2011 Dhar ................ H01L 29/1608
 257/77
2012/0329216 A1* 12/2012 Dhar .................... H01L 21/049
 438/135
2014/0264382 A1* 9/2014 MacMillan ......... H01L 29/1608
 257/77

\* cited by examiner

SILICON CARBIDE (SIC) MOSFET WITH A SILICON OXIDE LAYER CAPABLE OF SUPPRESSING DETERIORATION OF CARRIER MOBILITY AND VARIATION IN THRESHOLD VOLTAGE

CROSS-REFERENCE TO RELATED APPLICATION

This application is based upon and claims the benefit of priority from Japanese Patent Application No. 2016-107937, filed on May 30, 2016, the entire contents of which are incorporated herein by reference.

FIELD

Embodiments described herein relate generally to a semiconductor device, a method for manufacturing a semiconductor device, an inverter circuit, a driving device, a vehicle, and an elevator.

BACKGROUND

Silicon carbide (SiC) is expected to be used as a material for a next-general semiconductor device. SiC has better physical properties than silicon (Si). For example, SiC has a bandgap that is three times wider than that of Si, a breakdown field strength that is about ten times higher than that of Si, and a thermal conductivity that is about three times higher than that of Si. These characteristics can be used to achieve a semiconductor device which has low loss and can operate at a high temperature.

However, for example, when silicon carbide is used to form a metal oxide semiconductor field effect transistor (MOSFET), there is the problem that the mobility of carriers is reduced.

DETAILED DESCRIPTION

A semiconductor device according to an embodiment includes a silicon carbide layer, a gate electrode, and a silicon oxide layer disposed between the silicon carbide layer and the gate electrode, a number of single bonds between carbon atoms being larger than that of double bonds between carbon atoms in the silicon oxide layer.

In the following description, embodiments of the present invention will be explained with reference to the drawings. In the following explanation, the same reference numeral will be assigned to identical or similar members or the like, and for members or the like that have been once described, further explanation will not be repeated as appropriate.

In the following description, $n^+$, $n$, $n^-$, $p^+$, $p$, and $p^-$ indicate the relative levels of impurity concentration in each conductivity type. That is, $n^+$ indicates an n-type impurity concentration which is higher than that of n and $n^-$ indicates an n-type impurity concentration which is lower than that of n. In addition, $p^+$ indicates a p-type impurity concentration which is higher than that of p and $p^-$ indicates a p-type impurity concentration which is lower than that of p. In some cases, an $n^+$ type and an $n^-$ type are simply referred to as an n type and a $p^+$ type and a $p^-$ type are simply referred to as a p type.

First Embodiment

The semiconductor device according to this embodiment includes a silicon carbide layer, a gate electrode, and a silicon oxide layer disposed between the silicon carbide layer and the gate electrode, a number of single bonds between carbon atoms being larger than that of double bonds between carbon atoms in the silicon oxide layer.

Figure 1:
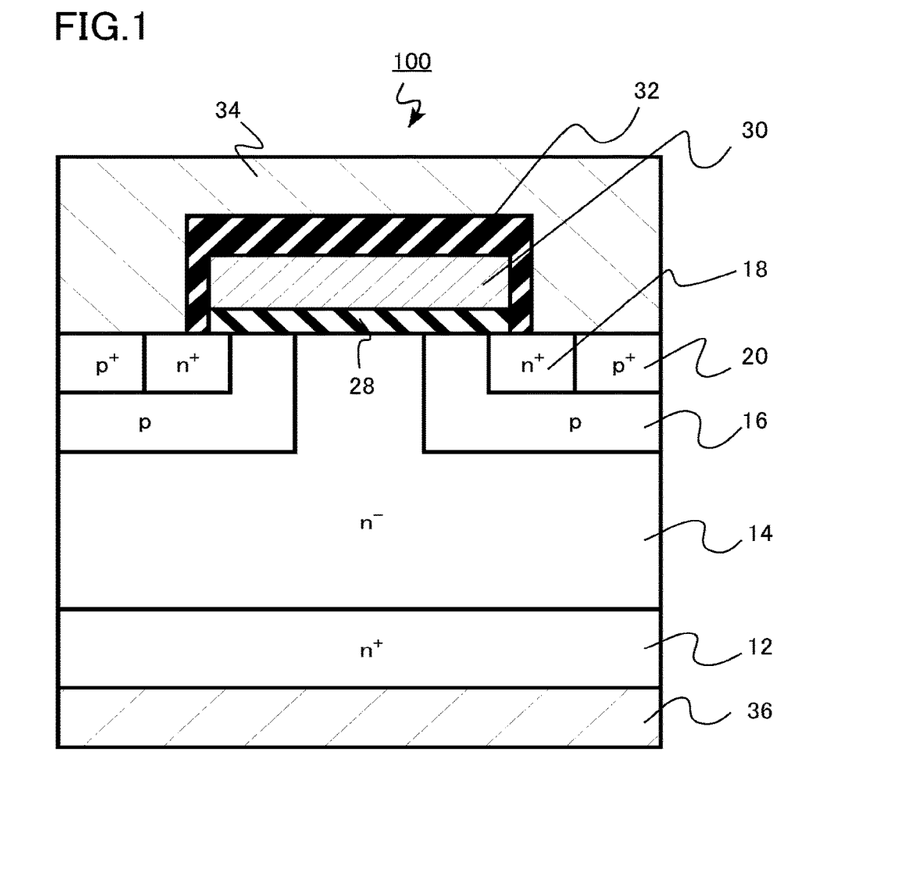
FIG. 1 is a cross-sectional view schematically illustrating a semiconductor device according to a first embodiment.

FIG. 1 is a cross-sectional view schematically illustrating a MOSFET which is the semiconductor device according to this embodiment. A MOSFET 100 is a double implantation MOSFET (DIMOSFET) in which a p well and a source region are formed by ion implantation. In addition, the MOSFET 100 is an n-channel MOSFET having electrons as carriers.

This MOSFET 100 includes a silicon carbide substrate 12, a drift layer 14, a p well region (silicon carbide layer) 16, a source region 18, a p well contact region 20, a silicon oxide layer 28, a gate electrode 30, an interlayer insulating film 32, a source electrode 34, and a drain electrode 36.

The silicon carbide substrate 12 is, for example, an $n^+$4H—SiC substrate. The silicon carbide substrate 12 has, for example, nitrogen (N) as n-type impurities. The n-type impurity concentration of the silicon carbide substrate 12 is, for example, equal to or greater than $1\times10^{18}$ cm$^{-3}$ and equal to or less than $1\times10^{20}$ cm$^{-3}$.

For example, the front surface of the silicon carbide substrate 12 is inclined at an angle that is equal to or greater than 0 degrees and equal to or less than 8 degrees with respect to a (0001) face. The (0001) face is referred to as a silicon face. For example, the front surface of the silicon carbide substrate 12 is inclined at an angle that is equal to or greater than 0 degrees and equal to or less than 8 degrees with respect to a (000-1) face. The (000-1) face is referred to as a carbon face.

The drift layer 14 is provided on the front surface of the silicon carbide substrate 12. The drift layer 14 is an $n^-$ silicon carbide layer. The drift layer 14 includes, for example, nitrogen as n-type impurities.

The n-type impurity concentration of the drift layer 14 is, for example, equal to or greater than $5\times10^{15}$ cm$^{-3}$ and equal to or less than $2\times10^{16}$ cm$^{-3}$. The drift layer 14 is, for example, a SiC epitaxial growth layer that is formed on the silicon carbide substrate 12 by epitaxial growth.

A surface of the drift layer 14 is also inclined at an angle that is equal to or greater than 0 degrees and equal to or less than 8 degrees with respect to the silicon face. The thickness of the drift layer 14 is, for example, equal to or greater than 5 µm and equal to or less than 100 µm.

The p well region 16 is provided in a portion of the surface of the drift layer 14. The p well region 16 is a p-type silicon carbide region. The p well region 16 includes, for example, aluminum (Al) as p-type impurities. The p-type impurity concentration of the p well region 16 is, for example, equal to or greater than $5\times10^{15}$ cm$^{-3}$ and equal to or less than $1\times10^{17}$ cm$^{-3}$.

The depth of the p well region 16 is, for example, equal to or greater than 0.4 µm and equal to or less than 0.8 µm. The p well region 16 functions as a channel region of the MOSFET 100.

A surface of the p well region 16 is also inclined at an angle that is equal to or greater than 0 degrees and equal to or less than 8 degrees with respect to the silicon face.

The source region 18 is provided in a portion of the surface of the p well region 16. The source region 18 is an n$^+$ silicon carbide layer. The source region 18 includes, for example, phosphorus (P) as n-type impurities. The n-type impurity concentration of the source region 18 is, for example, equal to or greater than $1\times10^{18}$ cm$^{-3}$ and equal to or less than $1\times10^{22}$ cm$^{-3}$.

The depth of the source region 18 is less than the depth of the p well region 16. The depth of the source region 18 is, for example, equal to or greater than 0.2 µm and equal to or less than 0.4 µm.

The well contact region 20 is provided in a portion of the surface of the p well region 16. The well contact region 20 is provided on the side of the source region 18. The well contact region 20 is a p$^+$ silicon carbide region.

The well contact region 20 includes, for example, aluminum as p-type impurities. The p-type impurity concentration of the well contact region 20 is, for example, equal to or greater than $1\times10^{18}$ cm$^{-3}$ and equal to or less than $1\times10^{22}$ cm$^{-3}$.

The depth of the p well contact region 20 is less than the depth of the p well region 16. The depth of the p well contact region 20 is, for example, equal to or greater than 0.2 µm and equal to or less than 0.4 µm.

The silicon oxide layer 28 is disposed between the p well region 16 and the gate electrode 30. The silicon oxide layer 28 is formed continuously on the surfaces of the drift layer 14 and the p well region 16.

The thickness of the silicon oxide layer 28 is, for example, equal to or greater than 30 nm and equal to or less than 150 nm. The silicon oxide layer 28 functions as a gate insulating layer for the MOSFET 100.

The silicon oxide layer 28 contains carbon. The carbon concentration in the silicon oxide layer 28 is, for example, equal to or greater than $4\times10^{17}$ cm$^{-3}$ and less than $2\times10^{19}$ cm$^{-3}$, when the case of high temperature thermal oxidation is considered. Furthermore, the carbon concentration is, for example, equal to or greater than $4\times10^{18}$ cm$^{-3}$ and less than $2\times10^{19}$ cm$^{-3}$.

There is a bond between carbon (C) atoms in the silicon oxide layer 28. The number of single bonds between carbon atoms in the silicon oxide layer 28 is greater than the number of double bonds between carbon atoms in the layer.

For example, the count value of photoelectrons caused by the single bond between carbon atoms can be compared with the count value of photoelectrons caused by the double bond between carbon atoms by X-ray photoelectron spectroscopy (XPS) to determine whether the number of single bonds between carbon atoms are larger than the number of double bonds between carbon atoms in the silicon oxide layer 28.

In addition, magnitude relation between the number of single bonds between carbon atoms and the number of double bonds between carbon atoms in the silicon oxide layer 28 can be determined by, for example, infrared spectroscopy and Raman spectroscopy.

For example, there may be a bond between a carbon atom and an oxygen (O) atom in the silicon oxide layer 28. There may be a bond between a carbon atom and a hydrogen (H) atom in the silicon oxide layer 28. There may be a bond between a carbon atom and a deuterium (D) atom in the silicon oxide layer 28. There may be a bond between a carbon atom and a fluorine (F) atom in the silicon oxide layer 28. There may be a bond between a carbon atom and a hydroxyl group (OH) in the silicon oxide layer 28.

The bond between a carbon atom and an oxygen (O) atom, the bond between a carbon atom and a hydrogen (H) atom, the bond between a carbon atom and a deuterium (D) atom, the bond between a carbon atom and a fluorine (F) atom, and the bond between a carbon atom and a hydroxyl group (OH) can be checked by, for example, X-ray photoelectron spectroscopy. The bond between a carbon atom and an oxygen (O) atom, the bond between a carbon atom and a hydrogen (H) atom, the bond between a carbon atom and a deuterium (D) atom, the bond between a carbon atom and a fluorine (F) atom, and the bond between a carbon atom and a hydroxyl group (OH) can be determined by, for example, infrared spectroscopy and Raman spectroscopy.

The distribution of carbon atoms in the silicon oxide layer 28 in the thickness direction may be identical to the distributions of oxygen atoms placed between the carbon atoms having a single bond therebetween, hydrogen atoms bonded to two carbon atoms having a single bond therebetween, deuterium atoms bonded to two carbon atoms having a single bond therebetween, fluorine atoms bonded to two carbon atoms having a single bond therebetween, and a hydroxyl group bonded to two carbon atoms having a single bond therebetween. The concentration and distribution of carbon, oxygen, hydrogen, deuterium, and fluorine having the above-mentioned bonding state in the silicon oxide layer 28 in the thickness direction can be measured by, for example, secondary ion mass spectroscopy (SIMS). In addition, for the concentration and distribution of carbon, oxygen, hydrogen, deuterium, and fluorine in the silicon oxide layer 28, the state of electrons and the space distribution thereof can be specified by, for example, XPS, TEM-EDX, an atom probe, and HR-RBS.

FIGS. 2A, 2B, 2C, 2D, and 2E are explanatory diagrams illustrating the silicon oxide layer according to this embodiment. FIGS. 2A, 2B, 2C, 2D, and 2E are diagrams illustrating the bonding state of carbon atoms in the silicon oxide layer 28.

Figure 2A:
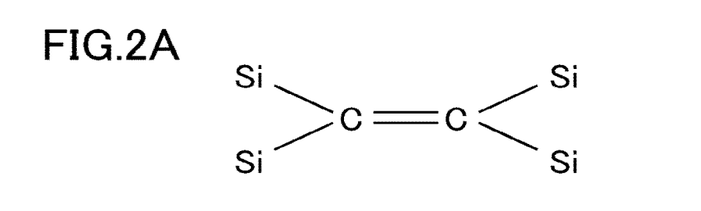
FIGS. 2A, 2B, 2C, 2D, and 2E are explanatory diagrams illustrating a silicon oxide layer according to the first embodiment.

FIG. 2A is a diagram illustrating a double bond between carbon atoms. FIGS. 2B, 2C, 2D, and 2E are diagrams illustrating singles bonds between carbon atoms.

Figure 2B:
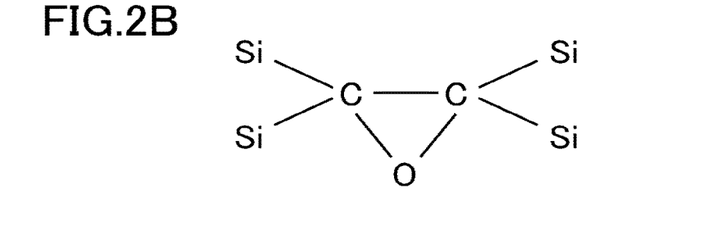

FIG. 2B shows the case in which carbon atoms bonded by a single bond are bonded to an oxygen atom. Two carbon atoms and one oxygen atom form a cyclic structure of C—C—O. In other words, the diagram shows a structure in which two carbon atoms bonded by a single bond are bonded to the same oxygen atom.

Figure 2C:
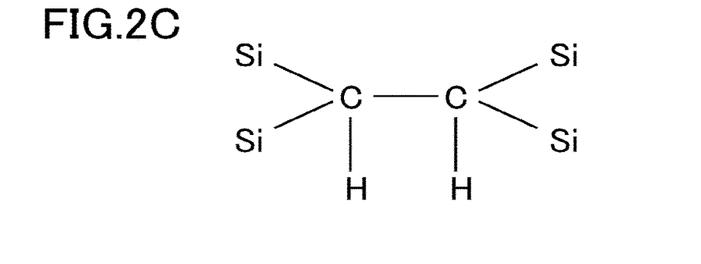

FIG. 2C shows the case in which carbon atoms bonded by a single bond are bonded to hydrogen atoms. The diagram shows a structure in which one hydrogen atom is bonded to each of two carbon atoms that are bonded by a single bond. The same also applies to a deuterium atom.

Figure 2D:
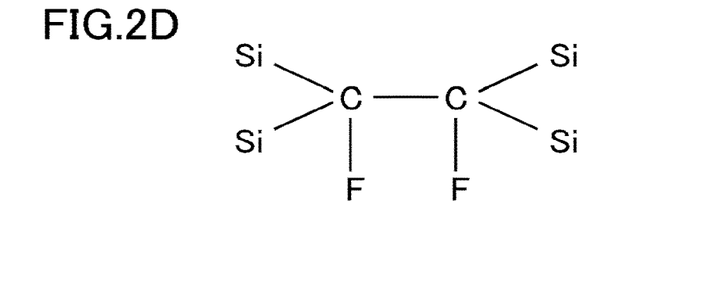

FIG. 2D shows the case in which carbon atoms bonded by a single bond are bonded to fluorine atoms. The diagram shows a structure in which one fluorine atom is bonded to each of two carbon atoms that are bonded by a single bond.

Figure 2E:
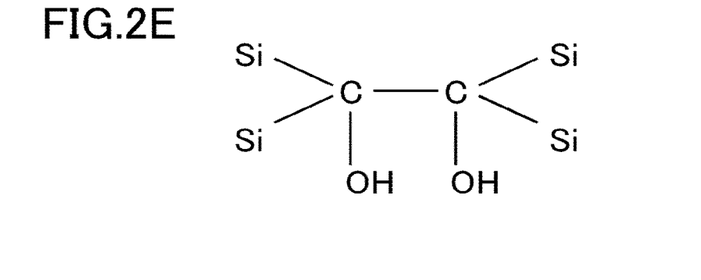

FIG. 2E shows the case in which carbon atoms bonded by a single bond are bonded to hydroxyl groups. The diagram shows a structure in which one hydroxyl group is bonded to each of two carbon atoms that are bonded by a single bond.

FIGS. 2A, 2B, 2C, 2D, and 2E illustrate structures in which two silicon atoms are bonded to each of two carbon atoms bonded by a single bond or a double bond; however, there may also be a structure in which oxygen atoms are bonded to carbon atoms, instead of silicon atoms.

The gate electrode 30 is provided on the silicon oxide layer 28. The gate electrode 30 can have, for example, polysilicon including n-type impurities or p-type impurities incorporated therein.

It is also possible to further provide an insulating layer having a higher permittivity than that of the silicon oxide layer 28, between the silicon oxide layer 28 and the gate electrode 30. The insulating layer is, for example, a silicon oxynitride (SiON) film, a silicon nitride (SiN) film, a hafnium oxide (HfO$_2$) film, a hafnium oxynitride (HfON) film, a hafnium oxide silicate (HfSiO) film, a hafnium oxynitride silicate (HfSiON) film, a zirconium oxide (ZrO$_2$) film, a zirconium oxynitride (ZrON) film, a zirconium oxide silicate (ZrSiO) film, a zirconium oxynitride silicate (ZrSiON) film, an aluminum oxide (AlO) film, or an aluminum oxynitride (AlON) film. The insulating layer may also be a stacked film of these films. For example, a stacked film of a SiON film and an HfSiON film, or a stacked film of ZrO$_2$/Al$_2$O$_3$/ZrO$_2$/Al$_2$O$_3$ films is effective.

The interlayer insulating film 32 is formed on the gate electrode 30. The interlayer insulating film 32 is, for example, a silicon oxide film.

The source electrode 34 is electrically connected to the source region 18 and the p well contact region 20. The source electrode 34 also functions as a p well electrode that applies potential to the p well region 16.

The source electrode 34 has, for example, a stacked structure of a nickel (Ni) barrier metal layer and an aluminum metal layer provided on the barrier metal layer. The nickel barrier metal layer and the silicon carbide layer may react with each other to form nickel silicide (for example, NiSi or Ni$_2$Si). An alloy may be formed by the reaction between the nickel barrier metal layer and the aluminum metal layer.

The drain electrode 36 is formed on a surface of the silicon carbide substrate 12 opposite to the drift layer 14, that is, on the rear surface. The drain electrode 36 is made of, for example, nickel. Nickel may react with the silicon carbide substrate 12 to form nickel silicide (for example, NiSi or Ni$_2$Si).

In this embodiment, the n-type impurities are, for example, nitrogen or phosphorus. Arsenic (As) or antimony (Sb) may be applied as the n-type impurities.

In this embodiment, the p-type impurities are, for example, aluminum. Boron (B), gallium (Ga), or indium (In) may be applied as the p-type impurities.

Next, a method for manufacturing the semiconductor device according to this embodiment will be described.

The method for manufacturing a semiconductor device according to this embodiment is carried out by forming a silicon oxide layer on a silicon carbide layer, subjecting the silicon oxide layer to a heat treatment in an atmosphere including at least any one substance from among oxygen, hydrogen, fluorine, deuterium, and water, while irradiating the silicon oxide layer with ultraviolet radiation, and forming a gate electrode on the silicon oxide layer.

Figure 3:
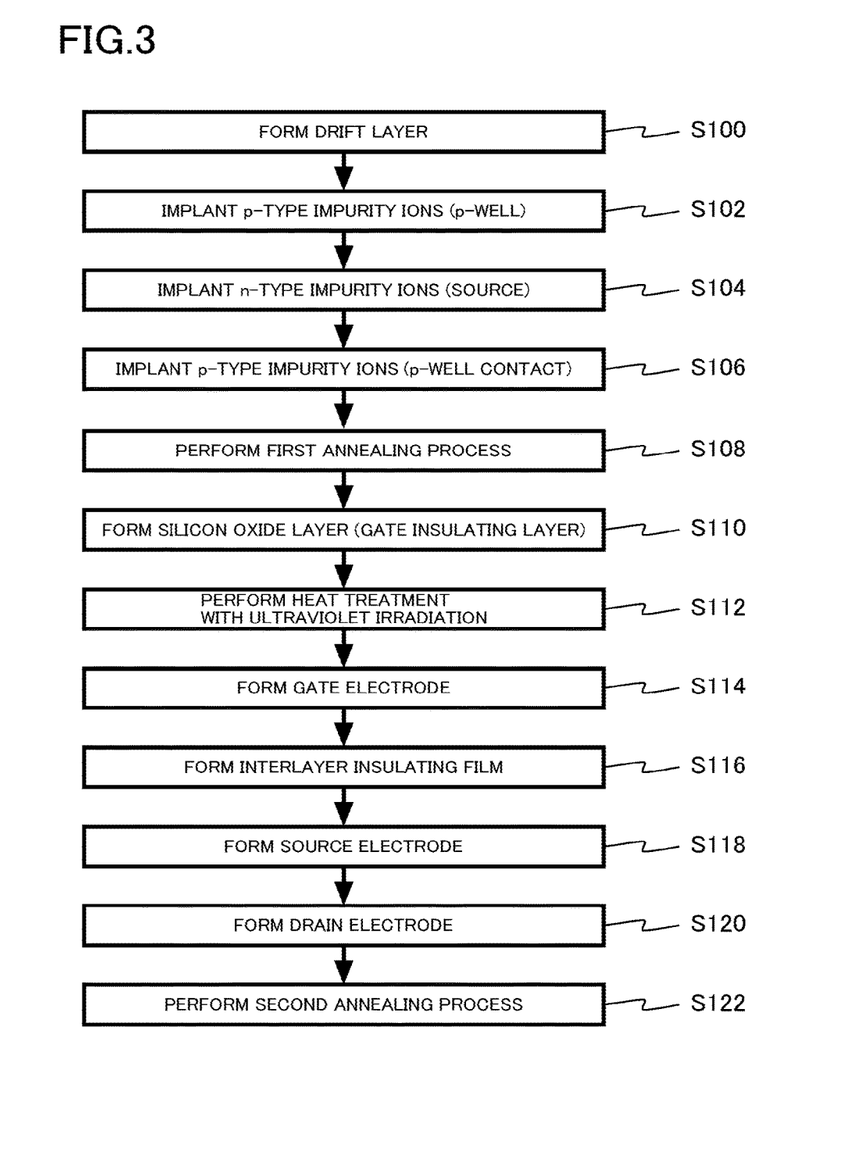
FIG. 3 is a process flow diagram illustrating a method for manufacturing the semiconductor device according to the first embodiment.

FIG. 3 is a process flow diagram illustrating the method for manufacturing a semiconductor device of this embodiment.

As illustrated in FIG. 3, the method for manufacturing a semiconductor device include formation of a drift layer (Step S100), p-type impurity ion implantation (Step S102), n-type impurity ion implantation (Step S104), p-type impurity ion implantation (Step S106), first annealing (Step S108), formation of a silicon oxide layer (Step S110), heat treatment with ultraviolet irradiation (Step S112), formation of a gate electrode (Step S114), formation of an interlayer insulating film (Step S116), formation of a first electrode (Step S118), formation of a second electrode (Step S120), and second annealing (Step S122).

First, the n$^+$ silicon carbide substrate 12 is prepared. The silicon carbide substrate 12 is made of, for example, 4H—SiC. The silicon carbide substrate 12 is, for example, a silicon carbide wafer W.

The silicon carbide substrate 12 includes nitrogen as n-type impurities. The n-type impurity concentration of the silicon carbide substrate 12 is, for example, equal to or greater than $1 \times 10^{18}$ cm$^{-3}$ and equal to or less than $1 \times 10^{20}$ cm$^{-3}$. The thickness of the silicon carbide substrate 12 is, for example, 350 μm. The silicon carbide substrate 12 may be thinned to about 90 μm before the drain electrode is formed on the rear surface of the silicon carbide substrate 12.

In Step S100, the drift layer 14 is formed on the silicon face of the silicon carbide substrate 12 by an epitaxial growth method. The drift layer 14 is made of 4H—SiC.

The drift layer 14 includes nitrogen as n-type impurities. The n-type impurity concentration of the drift layer 14 is, for example, equal to or greater than $5 \times 10^{15}$ cm$^{-3}$ and equal to or less than $2 \times 10^{16}$ cm$^{-3}$. The thickness of the drift layer 14 is, for example, equal to or greater than 5 μm and equal to or less than 100 μm.

In Step S102, first, a first mask member is formed by patterning using photolithography and etching. Then, aluminum ions which are p-type impurity ions are implanted into the drift layer 14, using the first mask member as an ion implantation mask. The p well region 16 is formed by the ion implantation.

In Step S104, first, a second mask member is formed by patterning using photolithography and etching. Then, nitrogen ions which are n-type impurity ions are implanted into the drift layer 14, using the second mask member as an ion implantation mask, to form the source region 18.

In Step S106, a third mask member is formed by patterning using photolithography and etching. Then, aluminum ions which are p-type impurity ions are implanted into the drift layer 14, using the third mask member as an ion implantation mask, to form the p well contact region 20.

In Step S108, a first annealing process for activating the p-type impurities and the n-type impurities is performed. For example, this annealing process is performed under the conditions of a heating temperature of 1750° C. and a heating time of 30 minutes, using argon (Ar) gas as atmosphere gas.

In Step S110, the drift layer 14 and the p well region (silicon carbide layer) 16 are thermally oxidized and the silicon oxide layer 28 is formed on the drift layer 14 and the p well region 16. The silicon oxide layer 28 functions as a gate insulating layer.

Thermal oxidation is performed in, for example, a dry oxygen-including atmosphere. The temperature for thermal oxidation is, for example, equal to or higher than 1100° C.

and equal to or lower than 1300° C. The thickness of the silicon oxide layer 28 is, for example, equal to or more than 30 nm and equal to or less than 150 nm.

Surplus carbon which has been generated by the thermal oxidation of the drift layer 14 and the p well region 16 is introduced into the silicon oxide layer 28. Then, the carbon introduced into the silicon oxide layer 28 forms a double bond in the silicon oxide layer 28 and is stabilized.

In Step S112, the silicon oxide layer 28 is subjected to a heat treatment while being irradiated with ultraviolet radiation. The heat treatment is carried out in an atmosphere including at least any one substance from among oxygen (O), hydrogen (H), fluorine (F), deuterium (D), and water ($H_2O$).

The temperature for the heat treatment is, for example, equal to or higher than 300° C. and equal to or lower than 900° C. However, the temperature for the heat treatment is 8000 or lower for the C-face; 850° or lower for the a-face, m-face, and (0-33-8)-face; and 900° C. or lower for the Si-face, in order to prevent the progress of substrate oxidation. A typical heat treatment temperature is 700° C., and this is a temperature that can be applied to any plane orientation. The energy of the ultraviolet radiation is, for example, equal to or greater than 5.0 eV and equal to or less than 6.0 eV. It is desirable that the temperature for the heat treatment is lower than the temperature for the thermal oxidation by which the silicon oxide layer 28 is formed.

Some of the double bonds between carbon atoms in the silicon oxide layer 28 are broken by irradiation with ultraviolet radiation, and single bonds between carbon atoms are formed. The carbon atoms that are bonded by a single bond are stabilized in the silicon oxide layer 28 by, for example, being bonded to oxygen atoms.

Figure 4:
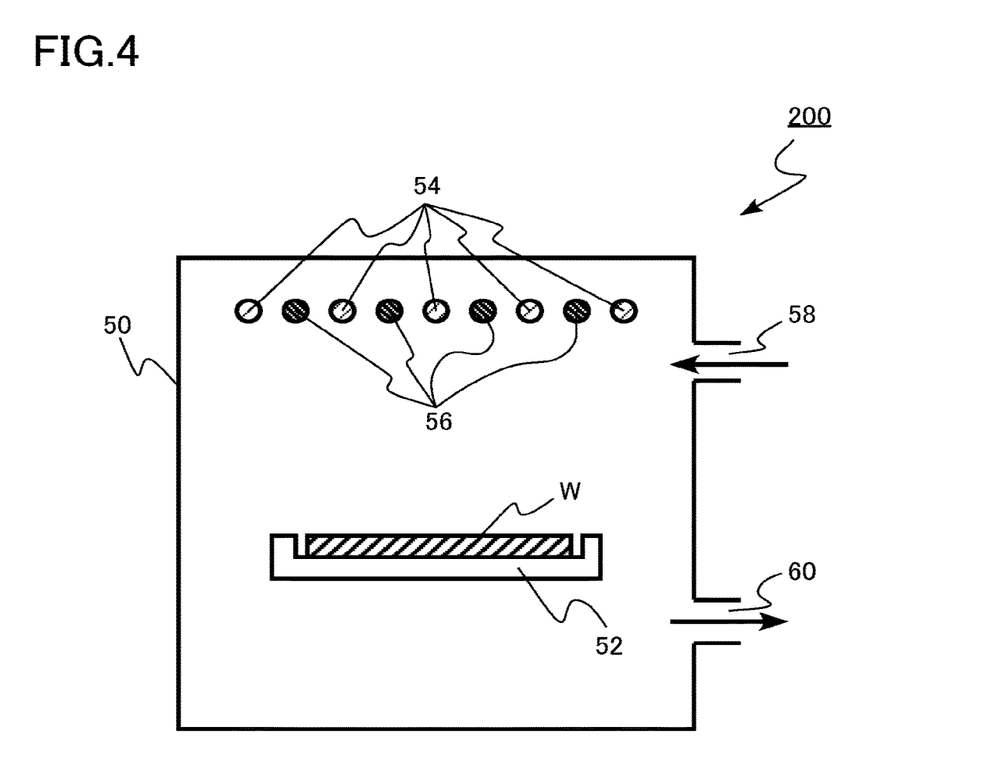
FIG. 4 is a schematic cross-sectional view illustrating a semiconductor manufacturing apparatus used in the manufacturing method according to the first embodiment.

FIG. 4 is a schematic cross-sectional view illustrating a semiconductor manufacturing apparatus used for the heat treatment with ultraviolet irradiation in Step S112. The semiconductor manufacturing apparatus is an infrared lamp heating apparatus 200.

The infrared lamp heating apparatus 200 includes a processing chamber 50, a susceptor (holding unit) 52, an infrared lamp 54, an ultraviolet lamp 56, a gas supply port 58, and a gas exhaust port 60.

The susceptor 52 is provided in the processing chamber 50. The silicon carbide wafer W can be placed on the susceptor 52.

The infrared lamp 54 is provided in the processing chamber 50. The silicon carbide wafer W is heated by infrared rays emitted from the infrared lamp 54.

The ultraviolet lamp 56 is provided in the processing chamber 50. The ultraviolet lamp 56 emits ultraviolet rays to the silicon carbide wafer W.

A gas that controls the atmosphere inside the processing chamber 50 is supplied into the processing chamber 50 through the gas supply port 58. Examples of the gas to be supplied include oxygen, hydrogen, fluorine, deuterium, water, nitrogen, and argon.

The gas inside the processing chamber 50 is discharged through the gas exhaust port 60.

At the time of the heat treatment with ultraviolet irradiation in Step S112, a silicon carbide wafer W having the silicon oxide layer 28 formed thereon is placed on the susceptor 52. Then, for example, dry oxygen is supplied into the processing chamber 50 through the gas supply port 58.

Subsequently, the silicon carbide wafer W is heated using the infrared lamp 54, while the silicon carbide wafer W is irradiated with ultraviolet radiation using the ultraviolet lamp 56.

In Step S114, a gate electrode 30 is formed on the silicon oxide layer 28. The gate electrode 30 is formed from, for example, polysilicon including n-type impurities or p-type impurities.

In Step S116, the interlayer insulating film 32 is formed on the gate electrode 30. The interlayer insulating film 32 is, for example, a silicon oxide film.

In Step S118, the source electrode 34 is formed. The source electrode 34 is formed on the source region 18, and the p well contact region 20. The source electrode 34 is formed by, for example, sputtering with nickel (Ni) and aluminum (Al).

In Step S120, the drain electrode 36 is formed. The drain electrode 36 is formed on the rear surface of the silicon carbide substrate 12. The drain electrode 36 is formed by, for example, sputtering with nickel.

In Step S122, a second annealing process is performed in order to reduce the contract resistance between the source electrode 34 and the drain electrode 36. For example, the second annealing process is performed in an argon gas atmosphere at a temperature that is equal to or greater than 400° C. and equal to or less than 1000° C.

The MOSFET 100 illustrated in FIG. 1 is formed by the above-mentioned manufacturing method.

Next, the function and effect of this embodiment will be described.

In a case in which a MOSFET is formed using silicon carbide, there is a problem that the mobility of carriers is deteriorated. Furthermore, there is a problem that variation in the threshold voltage occurs. In a case in which silicon oxide is used for the gate insulating layer, the states existing in the band gap of silicon oxide cause deterioration of the mobility of carriers or variation in the threshold voltage.

A case in which the silicon oxide layer 28 that serves as a gate insulating layer is formed by thermal oxidation of silicon carbide will be considered. When the surface of silicon carbide is oxidized, surplus carbon atoms are incorporated into the silicon oxide layer 28. Then, the carbon atoms that have been incorporated into the silicon oxide layer 28 form double bonds in the silicon oxide layer 28 and are stabilized.

Figure 5A:
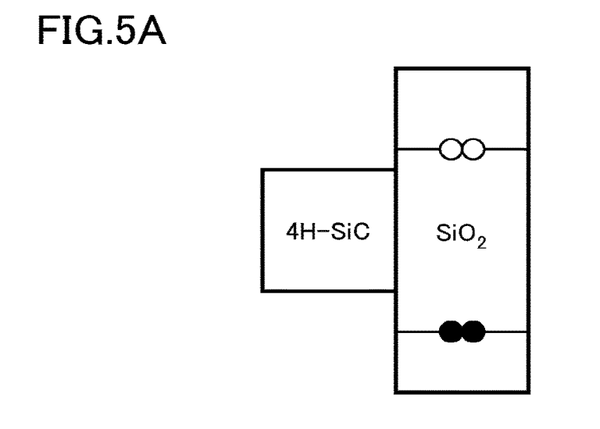
FIGS. 5A, 5B, and 5C are explanatory diagrams illustrating the function and effect of the first embodiment.
Figure 5B:
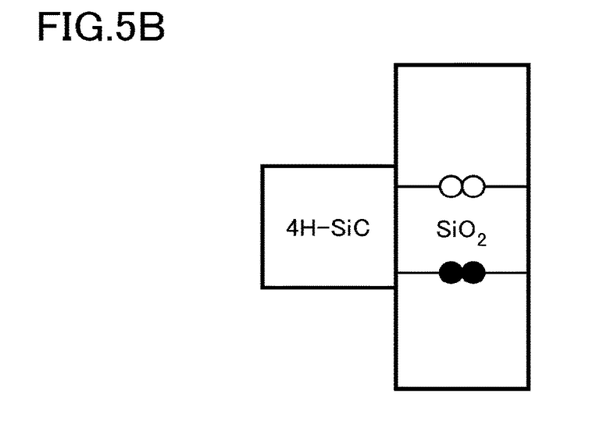
Figure 5C:
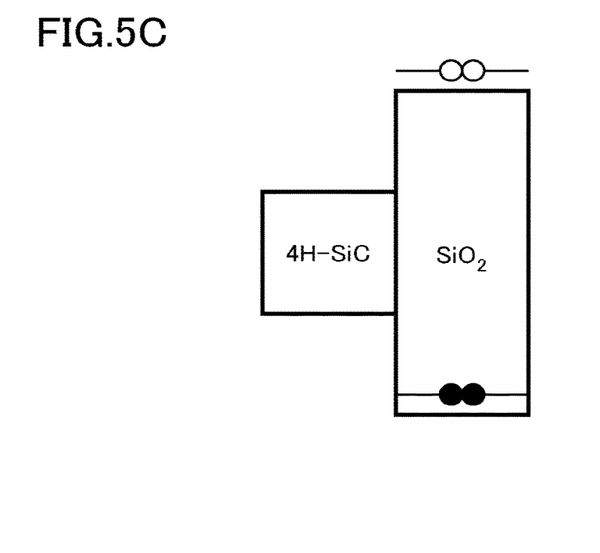

FIGS. 5A, 5B, and 5C are explanatory diagrams illustrating the function and effect of this embodiment. FIG. 5A and FIG. 5B are band diagrams in the case in which there are double bonds between carbon atoms in the silicon oxide layer 28. FIG. 5C is a band diagram in the case in which there are single bonds between carbon atoms in the silicon oxide layer 28. FIGS. 5A, 5B, and 5C are based on the first principle calculation implemented by the inventors.

In a case in which there are double bonds between carbon atoms in the silicon oxide layer 28, as illustrated in FIG. 5A and FIG. 5B, states that are not filled with electrons (white circles in FIGS. 5A, 5B, and 5C) and states that are filled with electrons (black circles in FIGS. 5A, 5B, and 5C) are generated in the silicon oxide layer 28. The states that are not filled with electrons are located in the vicinity of the lower end of the conduction band of 4H—SiC. In other words, states that serve as traps for electrons exist in the band gap of the silicon oxide layer 28.

For example, it is considered that, when electrons moving through a channel are trapped at the state which is not filled with electrons, the mobility of carriers in the MOSFET is reduced.

The state which is filled with electrons is located in the vicinity of the upper end of the valence band of 4H—SiC. As illustrated in FIG. 5B, in a case in which a state that is filled with electrons in the band gap of silicon oxide exists at a position higher than the upper end of the valence band of 4H—SiC, electrons are likely to flow toward 4H—SiC. At that time, fixed dipoles may be formed at the interface between silicon carbide and silicon oxide. In this case, the energy difference (hereinafter, also referred to as band offset ($\Delta Ec$)) between the lower ends of the conduction bands of silicon carbide (SiC) and silicon oxide ($SiO_2$) is reduced by the fixed dipoles.

When the band offset is reduced, the amount of leakage current flowing through the silicon oxide layer 28 increases. Therefore, trapping of electrons into the states in the band gap is accelerated. Therefore, the variation in the threshold voltage increases.

In a case in which there are single bonds between carbon atoms in the silicon oxide layer 28, as illustrated in FIG. 5C, there are only states that are filled with electrons in the silicon oxide layer 28. States that are not filled with electrons are located at positions shallower than the lower end of the conduction band of the silicon oxide layer 28. In other words, there are no electron-trapping states in the band gap of the silicon oxide layer 28.

States that are filled with electrons are located at positions that are deeper than the upper end of the valence band of 4H—SiC. The states that are filled with electrons are located in the vicinity of the upper end of the valence band of the silicon oxide layer 28.

Accordingly, in a case in which the bonds between carbon atoms in the silicon oxide layer 28 that constitutes a gate insulating layer are single bonds, electrons moving through the channels of the MOSFET are not trapped into the states of the silicon oxide film. Therefore, deterioration of the mobility of carriers in the MOSFET is suppressed.

Furthermore, states that are filled with electrons are located at positions that are deeper than the upper end of the valence band of 4H—SiC. For this reason, fixed dipoles are not formed at the interface between silicon carbide and silicon oxide. Therefore, reduction of the band offset does not occur. As a result, leakage current that flows through the silicon oxide layer 28 is suppressed. Accordingly, variation in the threshold voltage of the MOSFET 100 is suppressed.

In the MOSFET 100 according to this embodiment, the number of single bonds between carbon atoms in the silicon oxide layer 28 is greater than the number of double bonds between carbon atoms in the silicon oxide layer 28. Therefore, a reduction in the mobility of carriers in the MOSFET 100 is prevented. In addition, a variation in the threshold voltage of the MOSFET 100 is prevented. As a result, the MOSFET 100 with improved characteristics is achieved.

According to the manufacturing method of this embodiment, almost all of the double bonds between carbon atoms can be converted to single bonds. As a result, there is a possibility that states in the band gap may be lost, and thus mobility is enhanced. Furthermore, since states that are filled with electrons also move to positions deeper than the valence band of 4H—SiC, reduction of the band offset does not occur. Therefore, variation in the threshold voltage can also be suppressed.

In the MOSFET 100 of this embodiment, leakage current that flows through the silicon oxide layer 28 is suppressed. Therefore, the thickness of the silicon oxide layer 28 can be reduced, and the driving force of the MOSFET 100 can also be increased.

It is desirable that the count value of photoelectrons attributable to single bonds between carbon atoms as measured by X-ray photoelectron spectroscopy is equal to or more than 10 times the count value of photoelectrons attributable to double bonds between carbon atoms, from the viewpoint of enhancing the characteristics of the MOSFET 100. In regard to the analysis of C1s peaks by XPS, a state in which the peak of the single bond between carbon atoms increases, and the peak of the double bond between carbon atoms becomes almost invisible, can be achieved by the manufacturing method according to this embodiment. When sufficient processing is carried out, it is possible to promote a structural change to a state in which there are only single bonds between carbon atoms.

From the viewpoint of reducing the quantity of double bonds between carbon atoms, in regard to the analysis of the C1s peak byXPS, it is desirable that the peak value of the double bond between carbon atoms is equal to or less than 10%, more desirably equal to or less than 2%, and even more desirably equal to or less than 1%, of the peak value of the single bond between carbon atoms.

The carbon atoms that are bonded by a single bond are stabilized by means of oxygen, hydrogen, deuterium or fluorine; however, it is particularly desirable that the carbon atoms are bonded to oxygen. That is, it is desirable that the carbon atoms that are bonded by a single bond are bonded as illustrated in FIG. 2B. As the carbon atoms that are bonded by a single bond are bonded to an oxygen atom, stability of the single bond between carbon atoms is enhanced.

In a case in which the silicon oxide layer 28 is formed by thermal oxidation as described above, surplus carbon atoms that have been incorporated into the silicon oxide layer 28 form double bonds in the silicon oxide layer 28 and are stabilized. At this time, deterioration of mobility and decrease in reliability occur as a result of trapping of charges or migration of charges to the states in the band gap.

Figure 6:
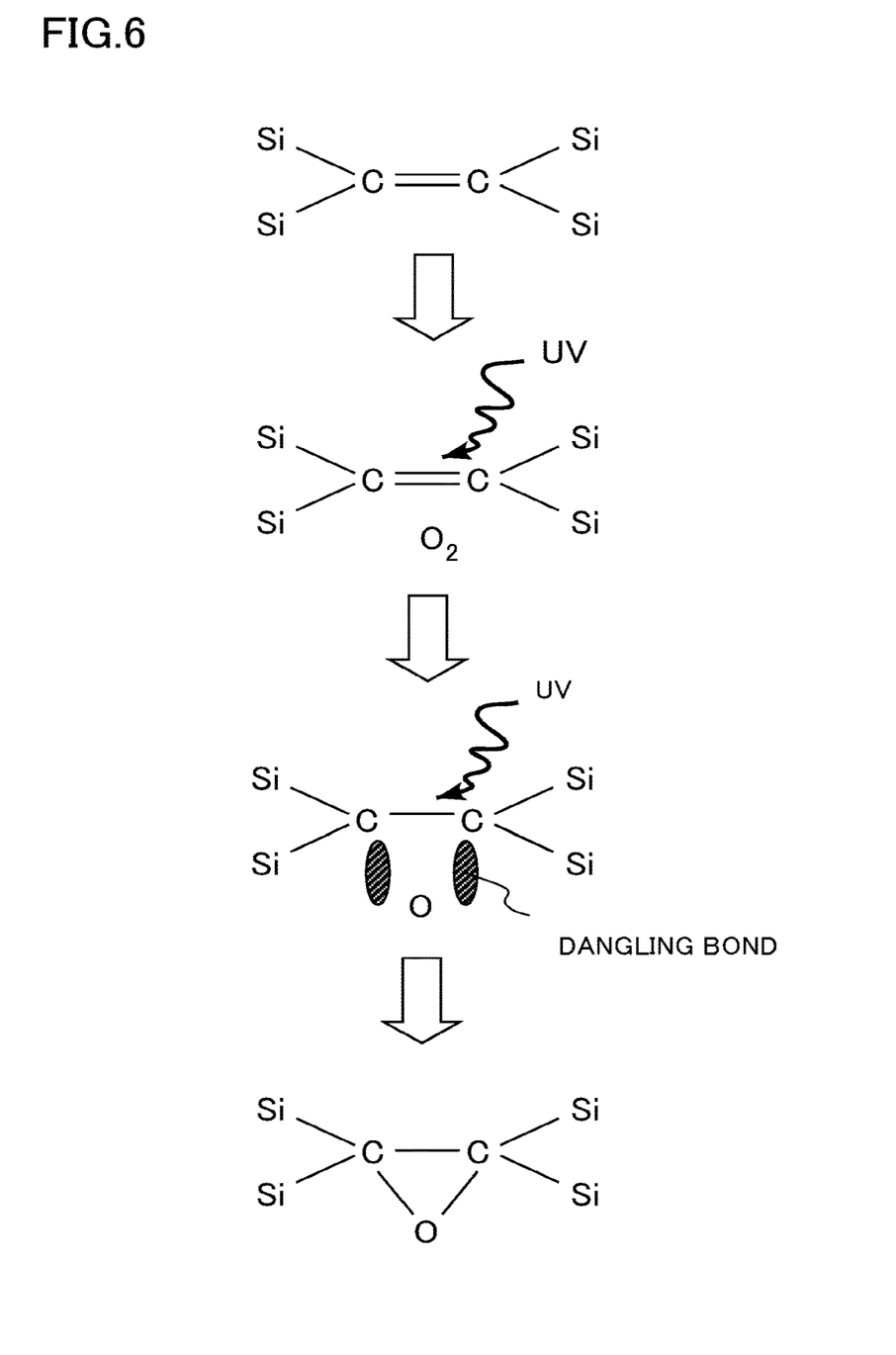
FIG. 6 is an explanatory diagram illustrating the function and effect of the first embodiment.
Figure 7:
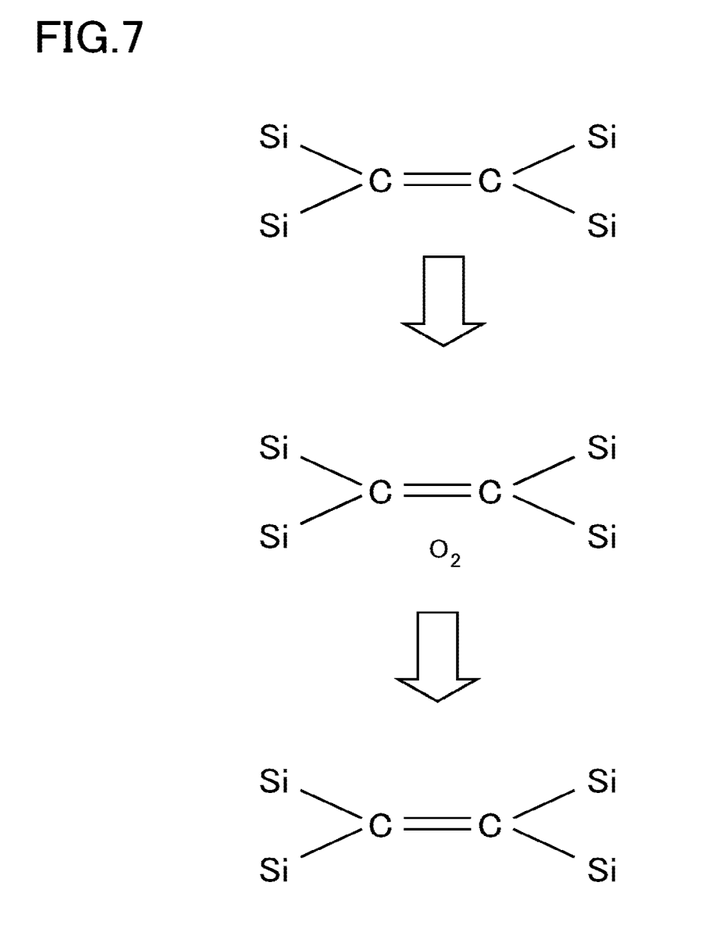
FIG. 7 is a diagram illustrating the function and effect of the first embodiment.

FIG. 6 and FIG. 7 are explanatory diagrams illustrating the function and effect of this embodiment. FIG. 6 illustrates the case in which a heat treatment is performed while irradiation with ultraviolet radiation is performed. FIG. 7 illustrates the case in which irradiation with ultraviolet radiation is not performed.

As illustrated in FIG. 6, in the method for manufacturing the MOSFET 100 according to this embodiment, the silicon oxide layer 28 is formed by thermal oxidation, and then a heat treatment is performed while the silicon oxide layer 28 is irradiated with ultraviolet radiation. Some of the double bonds that are stabilized in the silicon oxide layer 28 are broken by irradiation with ultraviolet radiation having high energy, and dangling bonds of carbon atoms are formed.

Then, double bonds between carbon atoms are converted to single bonds between carbon atoms. The carbon atoms that are bonded by a single bond are stabilized in the silicon oxide layer 28 when, for example, the carbon atoms are bonded to the oxygen supplied from the atmosphere of the heat treatment.

In contrast, as illustrated in FIG. 7, under oxygen diffusion without irradiation with ultraviolet radiation, double bonds between carbon atoms are maintained and are not converted to single bond between carbon atoms.

For example, when a heat treatment is not performed in an atmosphere including oxygen and only irradiation with ultraviolet rays is performed, the dangling bonds of carbon atoms remain. In this case, the remaining dangling bonds of carbon atoms function as a charge trap and there is a concern that the characteristics of the MOSFET will deteriorate.

Before a process is performed according to the manufacturing method of this embodiment, carbon atoms form a double bond therebetween and are stabilized. Therefore, the double bond between carbon atoms can be converted into the single bond between carbon atoms by the manufacturing method according to this embodiment. It is preferable the almost all of the double bonds between carbon atoms be converted into the single bonds between carbon atoms by the manufacturing method according to this embodiment.

It is desirable that the density of the double bonds between carbon atoms in the silicon oxide layer 28 is, for example, equal to or less than $2\times10^{16}$ cm$^{-3}$. The density of the double bonds between carbon atoms can be determined by, for example, calculation from the mass ratio between single bonds and double bonds, which is obtained by measurement of the carbon concentration by SIMS and measurement using X-ray photoelectron spectroscopy.

According to this embodiment, the carbon atoms that are bonded by a single bond can also be bonded to hydrogen atoms, deuterium atoms, fluorine atoms, or hydroxyl groups, instead of oxygen atoms, by changing the atmosphere employed for the heat treatment.

Furthermore, it is desirable that the energy of the ultraviolet radiation is equal to or greater than 5 eV and equal to or less than 6 eV. The energy of ultraviolet radiation depends on the wavelength of the ultraviolet radiation.

If the energy of ultraviolet radiation is less than 5 eV, it is difficult to break double bonds. Also, if the energy of ultraviolet radiation is greater than 6 eV, there is a risk that the bonds in the drift layer 14 below the silicon oxide layer 28 may break.

It is desirable that the temperature for the heat treatment is equal to or higher than 300° C. and equal to or lower than 900° C. If the temperature for the heat treatment is lower than the range described above, diffusion of the substances in the atmosphere of the heat treatment, for example, oxygen, into the silicon oxide layer 28 occurs insufficiently. Therefore, there is a risk that bonding between an oxygen atom and carbon atoms that are bonded by a single bond may not occur. Furthermore, if the temperature for the heat treatment is higher than the range described above, for example, there is a risk that oxidation of the drift layer 14 below the silicon oxide layer 28 may progress.

It is desirable that the thickness of the silicon oxide layer 28 is equal to or more than 30 nm and equal to or less than 150 nm. If the thickness is smaller than the range described above, there is a risk that the bonds in the drift layer 14 below the silicon oxide layer 28 may break during irradiation with ultraviolet radiation. Also, if the thickness is larger than the range described above, there is a risk that a region in which bonding between an oxygen atom and carbon atoms that are bonded by a single bond does not occur, may be formed. It is more desirable that the thickness of the silicon oxide layer 28 is equal to or more than 30 nm and equal to or less than 60 nm.

From the viewpoint of forming dense silicon oxide, it is desirable that the silicon oxide layer 28 is formed by thermal oxidation as described above. However, the process for forming the silicon oxide layer 28 is not limited to thermal oxidation, and for example, deposition of a silicon oxide film by a chemical vapor deposition growth method may also be employed.

For example, a silicon oxide film formed using tetraethyl orthosilicate (TEOS) as a source gas contains carbon in the film. Therefore, double bonds between carbon atoms are included in the film.

According to the manufacturing method of this embodiment, double bonds between carbon atoms are converted to single bonds between carbon atoms. Therefore, the manufacturing method according to this embodiment is still effective for a silicon oxide layer 28 containing carbon that has been formed by a chemical vapor deposition growth method.

As described above, according to this embodiment, a reduction in the mobility of carries in the MOSFET 100 is prevented. In addition, a variation in the threshold voltage of the MOSFET 100 is prevented. Therefore, the MOSFET 100 with improved characteristics is achieved.

Second Embodiment

An inverter circuit and a driving device according to this embodiment include the semiconductor device according to the first embodiment.

Figure 8:
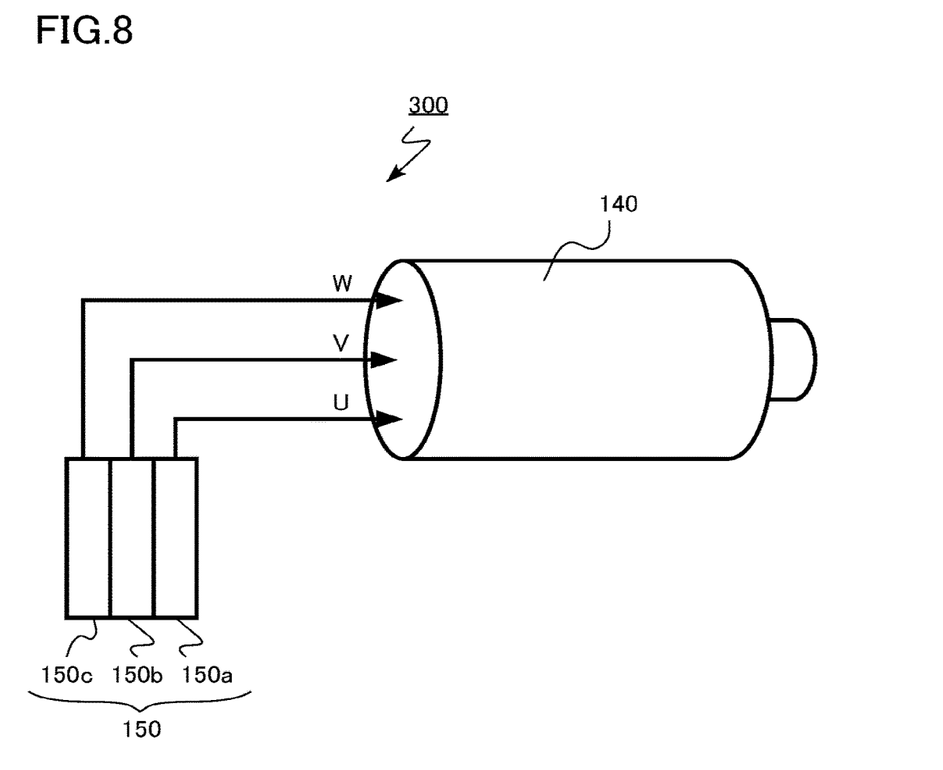
FIG. 8 is a schematic diagram of a driving device according to a second embodiment.

FIG. 8 is a schematic diagram illustrating a driving device according to this embodiment. The driving device 300 includes a motor 140 and an inverter circuit 150.

The inverter circuit 150 includes three semiconductor modules 150a, 150b, and 150c each of which has the MOSFET 100 according to the first embodiment as a switching element. The three semiconductor modules 150a, 150b, and 150c are connected in parallel to each other to form a three-phase inverter circuit 150 having three AC voltage output terminals U, V, and W. The motor 140 is driven by an AC voltage which is output from the inverter circuit 150.

According to this embodiment, since the MOSFET 100 with improved characteristics is provided, the characteristics of the inverter circuit 150 and the driving device 300 are improved.

Third Embodiment

A vehicle according to this embodiment includes the semiconductor device according to the first embodiment.

Figure 9:
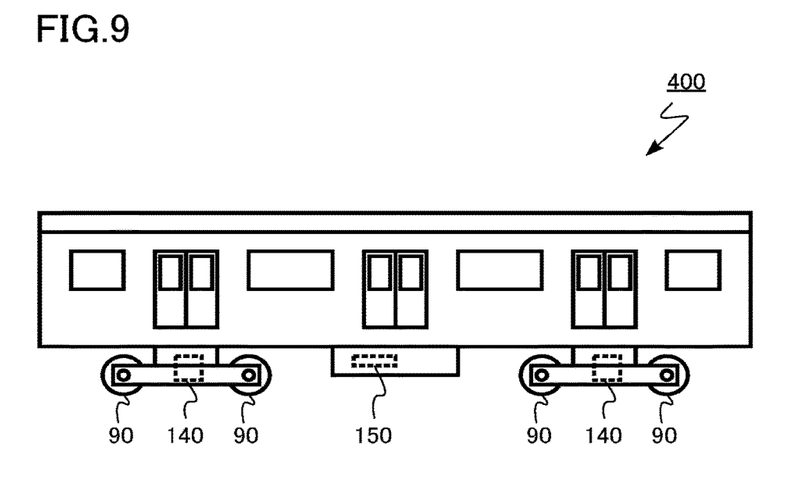
FIG. 9 is a schematic diagram of a vehicle according to a third embodiment.

FIG. 9 is a schematic diagram illustrating a vehicle according to this embodiment. A vehicle 400 according to this embodiment is a railway vehicle. The vehicle 400 includes a motor 140 and an inverter circuit 150.

The inverter circuit 150 includes three semiconductor modules each of which has the MOSFET 100 according to the first embodiment as a switching element. The three semiconductor modules are connected in parallel to each other to form a three-phase inverter circuit 150 having three AC voltage output terminals U, V, and W. The motor 140 is driven by an AC voltage which is output from the inverter circuit 150. Wheels 90 of the vehicle 400 are driven by the motor 140.

According to this embodiment, since the MOSFET 100 with improved characteristics is provided, the characteristics of the vehicle 400 are improved.

Fourth Embodiment

A vehicle according to this embodiment includes the semiconductor device according to the first embodiment.

Figure 10:
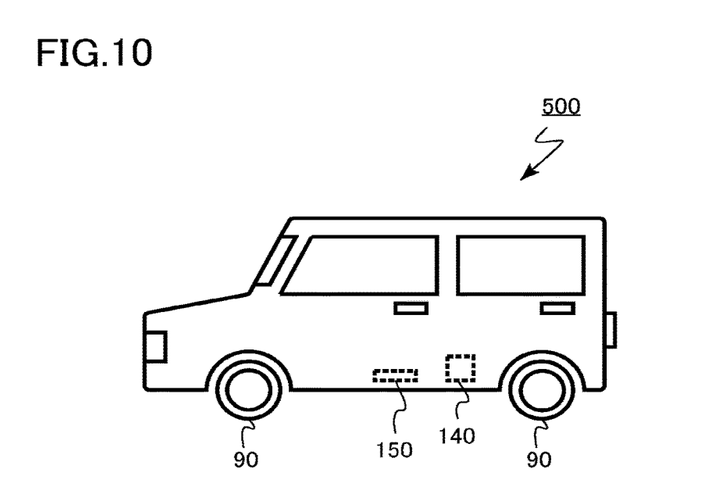
FIG. 10 is a schematic diagram of a vehicle according to a fourth embodiment.

FIG. 10 is a schematic diagram illustrating a vehicle according to this embodiment. A vehicle 500 according to this embodiment is an automotive vehicle. The vehicle 500 includes a motor 140 and an inverter circuit 150.

The inverter circuit 150 includes three semiconductor modules each of which has the MOSFET 100 according to the first embodiment as a switching element. The three semiconductor modules are connected in parallel to each other to form a three-phase inverter circuit 150 having three AC voltage output terminals U, V, and W.

The motor 140 is driven by an AC voltage which is output from the inverter circuit 150. Wheels 90 of the vehicle 500 are driven by the motor 140.

According to this embodiment, since the MOSFET 100 with improved characteristics is provided, the characteristics of the vehicle 500 are improved.

Fifth Embodiment

An elevator according to this embodiment includes the semiconductor device according to the first embodiment.

Figure 11:
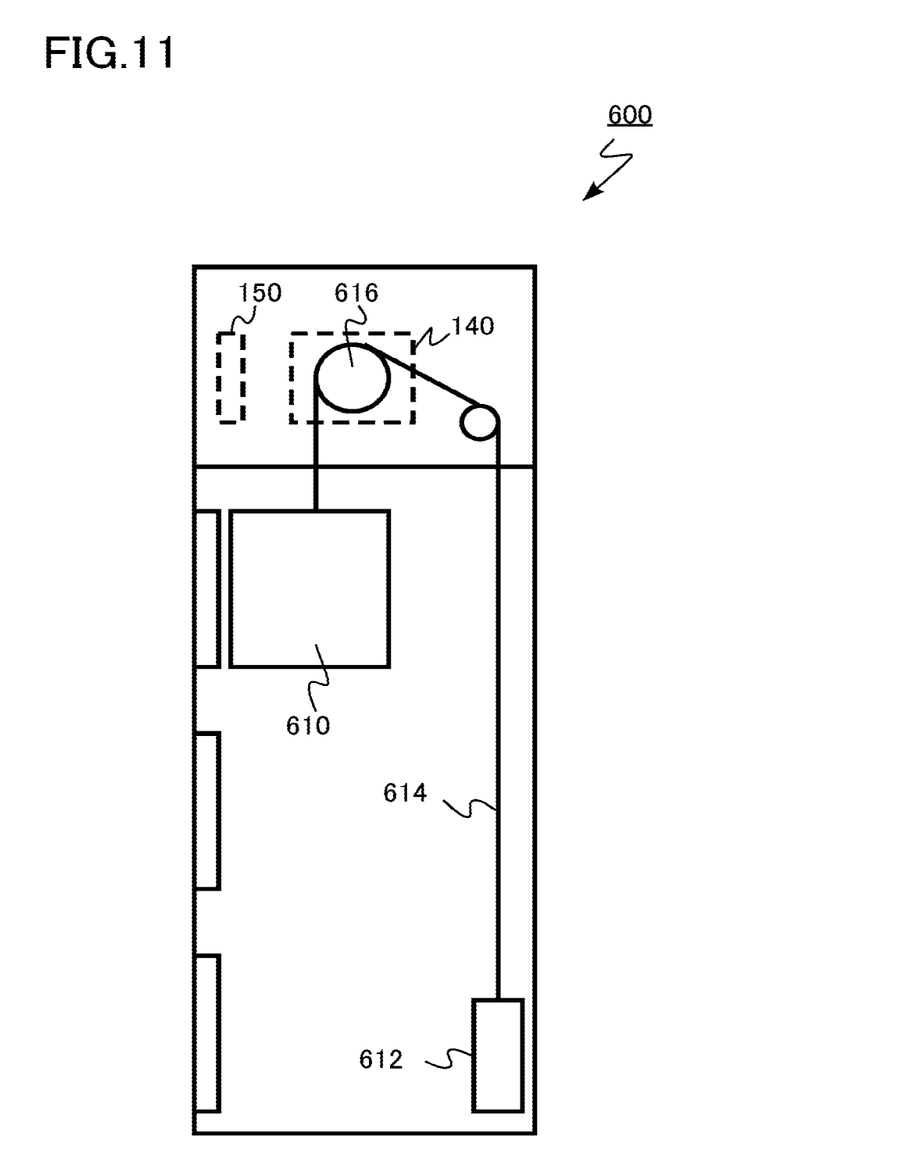
FIG. 11 is a schematic diagram of an elevator according to a fifth embodiment.

FIG. 11 is a schematic diagram illustrating an elevator according to this embodiment. An elevator 600 according to this embodiment includes a basket 610, a counter weight 612, a wire rope 614, a hoist 616, a motor 140, and an inverter circuit 150.

The inverter circuit 150 includes three semiconductor modules each of which has the MOSFET 100 according to the first embodiment as a switching element. The three semiconductor modules are connected in parallel to each other to form a three-phase inverter circuit 150 having three AC voltage output terminals U, V, and W.

The motor 140 is driven by an AC voltage which is output from the inverter circuit 150. The hoist 616 is rotated by the motor 140 to move up and down the basket 610.

According to this embodiment, since theMOSFET 100 with improved characteristics is provided, the characteristics of the elevator 600 are improved.

In the first embodiment, an example in which the crystal structure of silicon carbide is 4H—SiC has been described. However, the invention can be applied to silicon carbide with other crystal structures such as 6H—SiC and 3C—SiC.

In the first embodiment, an example in which the silicon oxide layer 28 is provided on the silicon face of silicon carbide has been described. However, the invention may be applied to a case in which the silicon oxide layer 28 is provided on other faces of silicon carbide, such as a carbon face, an a-face, an m-face, and a (0-33-8) face.

In the first embodiment, the n-channel planar MOSFET is given as an example. However, the invention may be applied to an n-channel trench MOSFET. The typical example of the side face of the trench is an a-face, an m-face, or a (0-33-8) face. The a-face and the m-face are perpendicular to the Si face and the C face. The (0-33-8) face is inclined at an angle of 54.7° with respect to the (0001) face in a <1-100> direction. This crystal face orientation is a crystal face corresponding to Si(001) in the Si crystal.

The invention may be applied to an n-channel insulated gate bipolar transistor (IGBT).

The invention is not limited to the n-channel type and may be applied to a p-channel MOSFET or IGBT.

Furthermore, in regard to the third to fifth embodiments, the cases of applying the semiconductor device according to the invention to vehicles or elevators have been explained as examples, and it is also possible to apply the semiconductor device according to the invention to, for example, a power conditioner of a photovoltaic power generation system.

While certain embodiments have been described, these embodiments have been presented by way of example only, and are not intended to limit the scope of the inventions. Indeed, the semiconductor device, the method for manufacturing a semiconductor device, the inverter circuit, the driving device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a silicon carbide layer;
   a gate electrode; and
   a silicon oxide layer disposed between the silicon carbide layer and the gate electrode, a number of single bonds between carbon atoms being larger than that of double bonds between carbon atoms in the silicon oxide layer.

2. The semiconductor device according to claim 1, wherein the silicon oxide layer further includes a bond between a carbon atom and an oxygen atom.

3. The semiconductor device according to claim 1, wherein the silicon oxide layer further includes at least one of a bond between a carbon atom and a hydrogen atom, and a bond between a carbon atom and a deuterium atom.

4. The semiconductor device according to claim 1, wherein the silicon oxide layer further includes a bond between a carbon atom and a fluorine atom.

5. The semiconductor device according to claim 1, wherein the silicon oxide layer has a structure in which two silicon atoms are bonded to each of two carbon atoms that are bonded by one of the single bonds.

6. The semiconductor device according to claim 1, wherein the silicon oxide layer has a structure in which same oxygen atom is bonded to two carbon atoms having one of the single bonds therebetween.

7. The semiconductor device according to claim 1, wherein the silicon oxide layer has a structure in which each of two carbon atoms having one of the single bonds therebetween is bonded to at least one selected from the group consisting of one hydrogen atom, one deuterium atom, one fluorine atom, and one hydroxyl group.

8. The semiconductor device according to claim 1, wherein a density of the double bonds between carbon atoms in the silicon oxide layer is equal to or less than $2 \times 10^{16}$ cm$^{-3}$.

9. The semiconductor device according to claim 1, wherein a thickness of the silicon oxide layer is equal to or more than 30 nm and equal to or less than 150 nm.

10. The semiconductor device according to claim 1, wherein a carbon concentration in the silicon oxide layer is equal to or more than $4 \times 10^{18}$ cm$^{-3}$ and equal to or less than $4 \times 10^{19}$ cm$^{-3}$.

11. An inverter circuit comprising:
    the semiconductor device according to claim 1.

12. A driving device comprising:
    the semiconductor device according to claim 1.

13. A vehicle comprising:
    the semiconductor device according to claim 1.

14. An elevator comprising:
    the semiconductor device according to claim 1.

* * * * *